(12) United States Patent
Patil et al.

(10) Patent No.: US 12,740,072 B2
(45) Date of Patent: Sep. 15, 2026

(54) DISCRETE DEVICE INTERCONNECTIONS BETWEEN STACKED SUBSTRATES

(71) Applicant: QUALCOMM Incorporated, San Diego, CA (US)

(72) Inventors: Aniket Patil, San Diego, CA (US); Hong Bok We, San Diego, CA (US); Zhijie Wang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 435 days.

(21) Appl. No.: 18/168,331

(22) Filed: Feb. 13, 2023

(65) Prior Publication Data

US 2024/0276739 A1 Aug. 15, 2024

(51) Int. Cl.
*H10B 80/00* (2026.01)
*H01L 25/16* (2023.01)
*H10W 90/00* (2026.01)

(52) U.S. Cl.
CPC ............ *H10B 80/00* (2023.02); *H10W 90/00* (2026.01); *H10W 90/401* (2026.01); *H10W 90/701* (2026.01); *H10W 90/724* (2026.01)

(58) Field of Classification Search
CPC ............ H10D 1/68; H10D 1/692; H10D 1/66; H10D 1/00; H01G 4/38; H01G 4/33; H01G 4/00; H01G 2/06; H01G 2/065; H01G 15/00; H01G 17/00; H01L 2924/19041; H01L 2924/19105; H01L 2924/19104; H01L 2924/19103; H01L 2924/191; H01L 2924/19101; H01L 2924/19102; H01L 2924/19106; H01L 2924/1904; H01L 2924/19011
See application file for complete search history.

(56) References Cited

U.S. PATENT DOCUMENTS

2015/0076700 A1* 3/2015 Yap ........................ H10W 90/00 257/773
2017/0077072 A1* 3/2017 Yap ........................ H10P 72/74
2020/0381405 A1* 12/2020 Patil ........................ H10P 72/74
2021/0225822 A1 7/2021 Lu et al.
2022/0189934 A1* 6/2022 Kim .................... H01L 23/5384
2022/0328417 A1* 10/2022 Patil ........................ H01L 24/16
2022/0384320 A1* 12/2022 Lee ........................ H01L 23/642

OTHER PUBLICATIONS

International Search Report and Written Opinion—PCT/US2024/013532—ISA/EPO—Jun. 6, 2024.

* cited by examiner

*Primary Examiner* — Lawrence C Tynes, Jr.
(74) *Attorney, Agent, or Firm* — Muncy, Geissler, Olds & Lowe, P.C.

(57) ABSTRACT

Disclosed is a stacked substrate package that incorporate surface mounted devices (SMD) between the base and interposer substrates. The SMDs, which may be passive devices (e.g., capacitor, inductor, resistor, etc.), may be electrically coupled to power distribution routing layers of the base and/or the interposer substrates. In this way, clean power may be provided to the devices (e.g., SoC dies, memory dies, etc.) of the stacked substrate package.

20 Claims, 9 Drawing Sheets

100
170
120
130
150
140
160
110
180

DISCRETE DEVICE INTERCONNECTIONS BETWEEN STACKED SUBSTRATES

FIELD OF DISCLOSURE

This disclosure relates generally to discrete devices, and more specifically, but not exclusively, to discrete device interconnections between stacked substrates, and fabrication techniques thereof.

BACKGROUND

Integrated circuit technology has achieved great strides in advancing computing power through miniaturization of active components. The package devices can be found in many electronic devices, including processors, servers, radio frequency (RF) integrated circuits, etc. Packaging technology becomes cost-effective in high pin count devices and/or high production volume components.

It is known to stack multiple substrates in package-on-package (PoP) or stacked substrate package devices. In such packages, copper (Cu) core ball is used to maintain stacked substrates. However, Cu core ball can be expensive. Also, clean power distribution can become difficult due to the multiple substrates.

Accordingly, there is a need for systems, apparatus, and methods that overcome the deficiencies of conventional stacked substrate packages including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An stacked substrate package is disclosed. The stacked substrate package may comprise a base substrate. The stacked substrate package may also comprise an interposer substrate above the base substrate. The stacked substrate package may further comprise a plurality of interposer connects between the base substrate and the interposer substrate. The plurality of interposer connects may provide electrical paths between the base substrate and the interposer substrate. The stacked substrate package may yet comprise a die between the base substrate and the interposer substrate. The die may be electrically coupled to the base substrate. The stacked substrate package may yet further comprise one or more surface mounted devices (SMD) between the base substrate and the interposer substrate. Each SMD may be electrically coupled to the base substrate, the interposer substrate, or both.

A method of fabricating a stacked substrate package is disclosed. The method may comprise providing a base substrate. The method may also comprise providing an interposer substrate above the base substrate. The method may further comprise forming a plurality of interposer connects between the base substrate and the interposer substrate.

The plurality of interposer connects may provide electrical paths between the base substrate and the interposer substrate. The method may yet comprise providing a die between the base substrate and the interposer substrate. The die may be electrically coupled to the base substrate. The method may yet further comprise providing one or more surface mounted devices (SMD) between the base substrate and the interposer substrate. Each SMD may be electrically coupled to the base substrate, the interposer substrate, or both.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1:
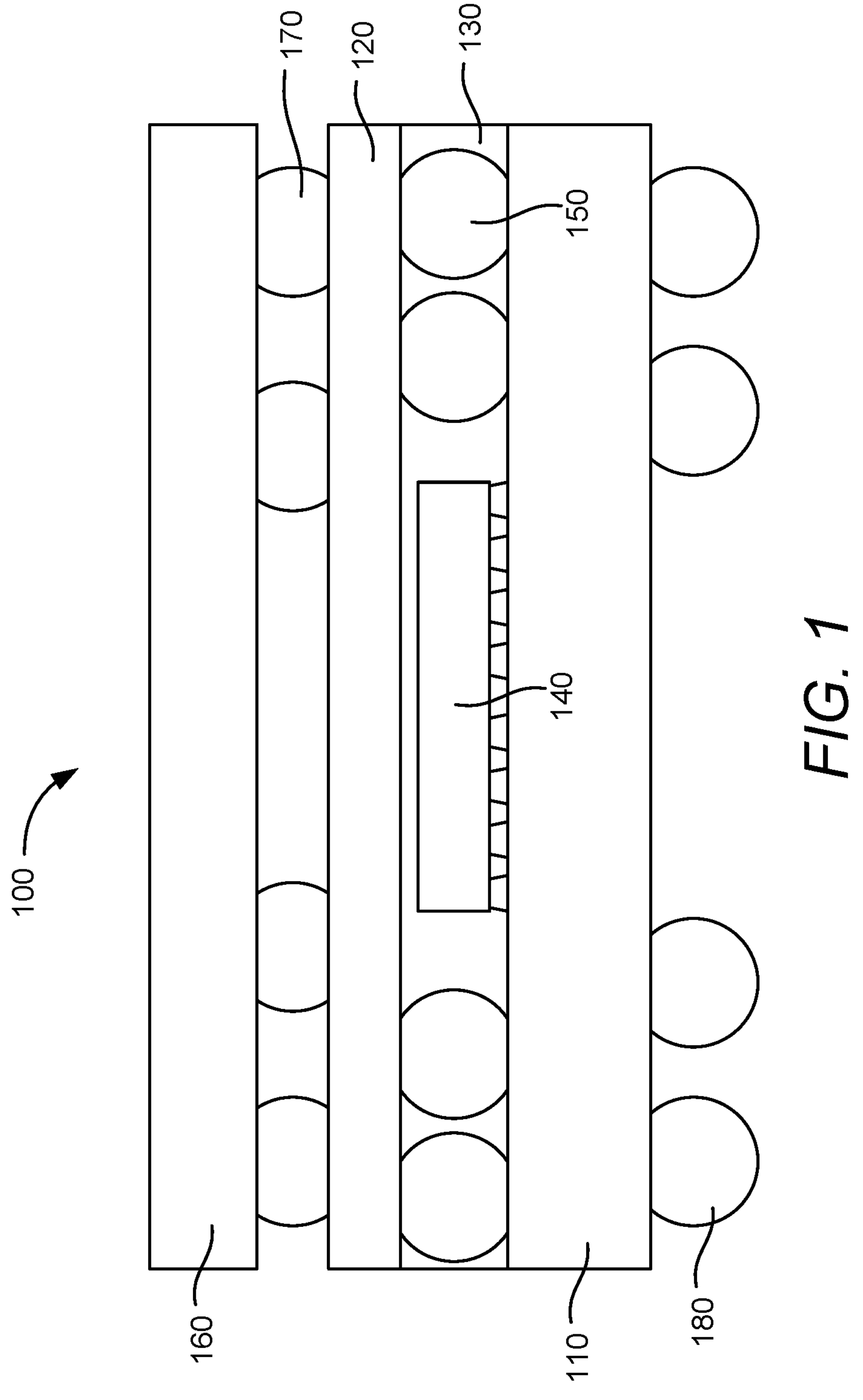
FIG. 1 illustrates a conventional stacked substrate package.

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms “a,” “an,” and “the” are intended to include the plural forms as well, unless the context clearly indicates otherwise. It will be further understood that the terms “comprises,” “comprising,” “includes,” and/or “including,” when used herein, specify the presence of stated features, integers, steps, operations, elements, and/or components, but do not preclude the presence or addition of one or more other features, integers, steps, operations, elements, components, and/or groups thereof.

It is mentioned above that conventional stacked substrate package can be expensive and that clean power distribution can be problematic. FIG. 1 illustrates a conventional stacked substrate package. As seen, the conventional stacked substrate package 100 includes a base substrate 110 and an interposer substrate 120. The base substrate 110 may also be referred to as a bottom or main substrate.

In between the base and interposer substrates 110, 120, there may be a plurality of copper (Cu) core balls 150. The copper core balls 150 helps to maintain a stack height or spacing between the base and interposer substrates 110, 120. A system-on-chip (SoC) die 140 is placed between the base and interposer substrates 110, 120. The die 140 is electrically coupled to the base substrate 110. Any remaining space between the base and interposer substrates 110, 120 is filled with a molding or encapsulant 130. A plurality of solder balls 180 is provided to enable connection with external devices.

A package-on-package (PoP) memory 160 is placed above the interposer substrate 120. A plurality of PoP balls electrically couples the memory 160 with the interposer substrate 120. In this way, power may be provided to the PoP memory 160 and the die 140 through connections in the base substrate 110, the interposer substrate 120, the core balls 150 and the PoP balls 170. However, providing clean power to the die 140 and/or to the memory 160 can be problematic.

In accordance with the various aspects disclosed herein, to address issues associated with conventional stacked substrate packages, it is proposed to provide stacked substrate packages in which power distribution network (PDN) is improved. In one or more aspects, passive devices—e.g., capacitor, inductor, etc.—are provided to enable clean power distribution to the active devices.

Figure 2:
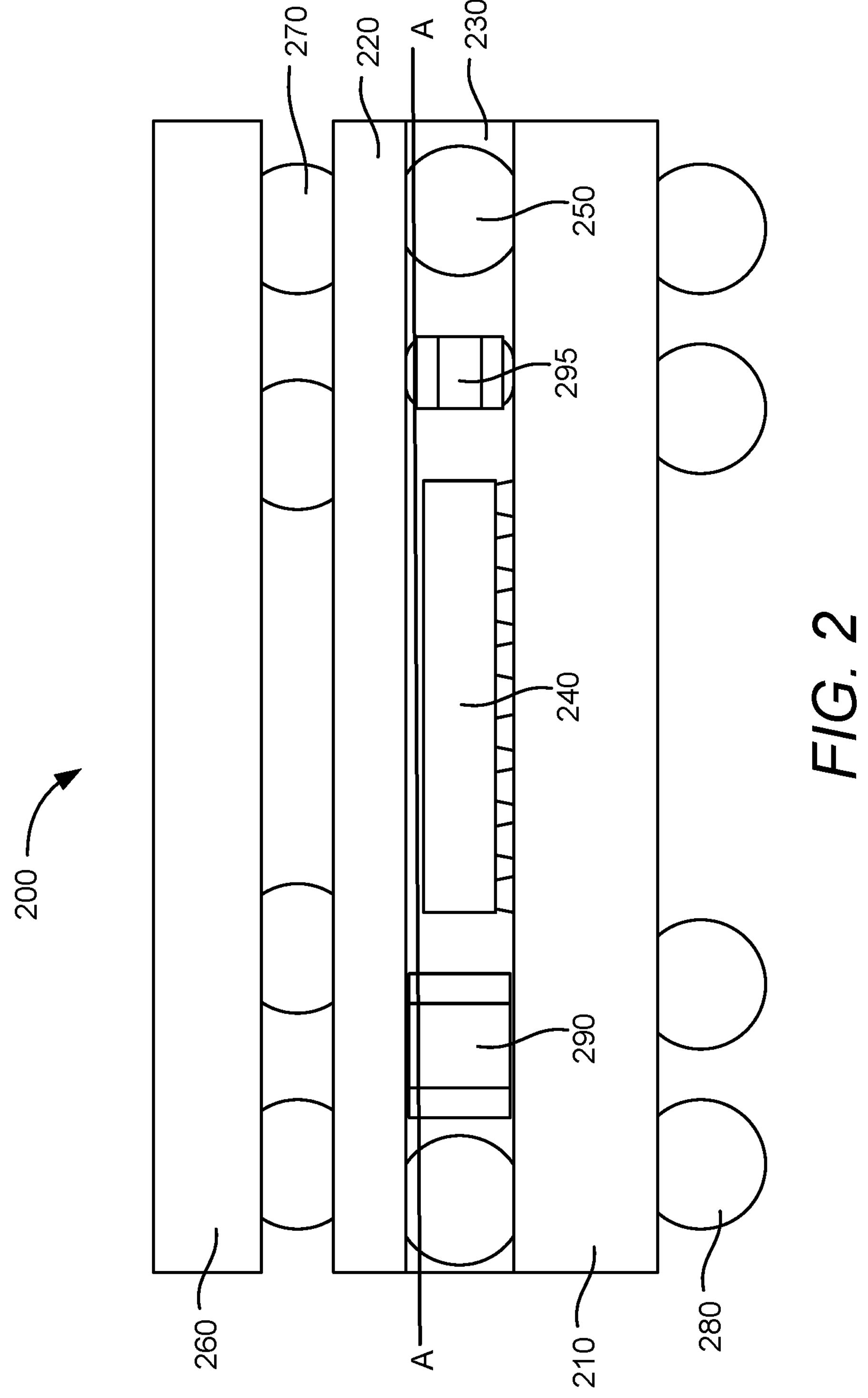
FIG. 2 illustrates a stacked substrate package in accordance with one or more aspects of the disclosure.

FIG. 2 illustrates a stacked substrate package in accordance with one or more aspects of the disclosure. The stacked substrate package 200 may include a base substrate 210 and an interposer substrate 220. The base substrate 110 may also be referred to as a bottom or main substrate. While not shown, the base substrate 110 may include one or more routing layers configured to route or otherwise distribute control and data signals. The base substrate 210 may also include one or more routing layers of a power distribution networks (PDN) to distribute power (e.g., VDD, VDDQ, VDD2, gnd, etc.). Also while not shown, the interposer substrate 220 may similarly include one or more routing layers configured to route or otherwise distribute control and data signals and may include one or more routing layers of the PDN.

In between the base and interposer substrates 210, 220, the stacked substrate package 200 may include one or more interposer connects 250. Each interposer connect 250 may be a solder ball (Pb or Pb free), a copper core ball, a CCB bump, etc. The interposer connects 250 may be configured to provide electrical paths between the base substrate 210 and the interposer substrate 220. That is, the interposer connects 250 may electrically couple signal routing layers of the base substrate 210 with the signal routing layers of the interposer substrate 220, and electrically couple power routing layers of the base substrate 210 with the power routing layers of the interposer substrate 220. The interposer connects 250 may also be configured to maintain a distance between the base and interposer substrates 210, 220.

One or more dies 240 may be placed between base and interposer substrates 210, 220. For simplicity, one die 240 is illustrated in FIG. 2. The die 240 may be an application processor die, such as a system-on-chip (SoC) die. In an aspect, the die 240 may be electrically coupled to the base substrate 210. That is, the die 240 may be connected to the signal and power routing layers within the base substrate 210.

One or more surface mounted devices (SMD) 290, 295 may be placed between the base and interposer substrates 210, 220. The SMDs 290, 295 may be passive devices, such as capacitors, inductors, resistors, etc. Each SMD 290, 295 may be electrically coupled to the base substrate 210, to the interposer substrate 220, or both. For example, each SMD 290, 295 may comprise first and second terminals, and the terminals of the SMDs 290, 295 may be coupled to the PDN routing layers of the base substrate 210 and/or the PDN routing layers of the interposer substrate 220.

Each SMD may be a horizontal SMD 290 or a vertical SMD 295. In an aspect, whether an SMD is horizontal or vertical may be decided based on orientation of a direction from the first to the second terminal of the SMD. As seen in FIG. 2, in a horizontal SMD 290, the direction from the first terminal to the second terminals is parallel to an orientation of the base substrate 210 and/or to an orientation of the interposer substrate 220. But in a vertical SMD 295, the direction from the first terminal and second terminals is perpendicular (more or less) to the orientation of the base substrate 210 and/or to the orientation of the interposer substrate 220.

A horizontal SMD 290 may be electrically coupled to the base substrate 210 and/or to the interposer substrate 220. That is, a first terminal of the horizontal SMD 290 may be electrically coupled to a routing layer (e.g., PDN routing layer) of the base substrate 210, or to a routing layer (e.g., PDN routing layer) of the interposer substrate 220, or both. Also, a second terminal of the horizontal SMD 290 may be electrically coupled to a routing layer (e.g., PDN routing layer) of the base substrate 210, or to a routing layer (e.g., PDN routing layer) of the interposer substrate 220, or both.

A vertical SMD 295 may be electrically coupled to both the base substrate 210 and the interposer substrate 220. That is, a first terminal of the vertical SMD 295 may be electrically coupled to a routing layer (e.g., PDN routing layer) of the base substrate 210, and a second terminal of the vertical SMD 295 may be electrically coupled to a routing layer (e.g., PDN routing layer) of the interposer substrate 220.

Spaces not occupied by the die 240, the SMDs 290, 295 and the interposer connects 250 may be filled with a molding or encapsulant 230. That is, the molding/encapsulant 230 may encapsulate the die 240, the SMDs 290, 295, and the interposer connects 250 between the base and interposer substrates 210, 220.

In an aspect, the SMDs 290, 295 may also be configured to maintain the distance between the base and interposer substrates 210, 220. This can be particularly true for the vertical SMDs 295. As such, the SMDs 290, 295 may take place of some of the copper core balls 150 of the conventional stacked substrate package 100. That is, locations previously occupied by the copper core balls 150 of the conventional stacked substrate package 100 may now be occupied by the interposer connects 250 and SMDs 290, 295 in the proposed stacked substrate package 200.

Figure 3:
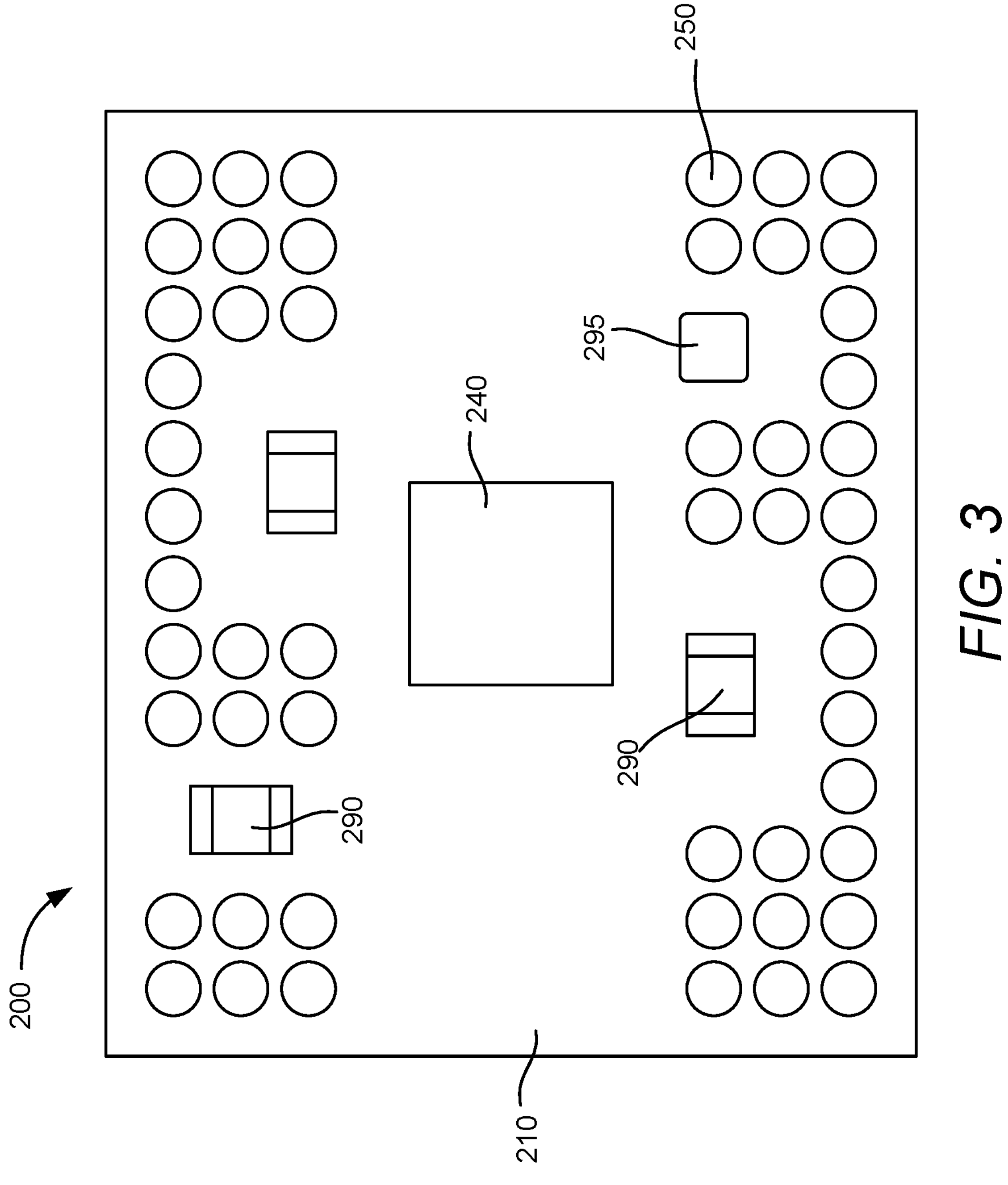
FIG. 3 illustrates a top view of a stacked substrate package in accordance with one or more aspects of the disclosure.

This is illustrated in FIG. 3 which illustrates a top view of the stacked substrate package 200 along the line A-A of FIG. 2. Note the placements of the interposer connects 250 and the SMDs 290, 295 on the base substrate 210. For simplicity, the molding 230 is not shown. The keep-out-zones (KOZ) are maintained.

Referring back to FIG. 2, the stacked substrate package 200 may further comprise a device 260 above the interposer substrate 220 and a plurality of device connects 270 may electrically couple the device 260 with the interposer substrate 220. In an aspect, the device 260 may be a flip chip die such as memory (e.g., DRAM). In this instance, the device connects 270 may also be referred to as flip chip connects 270. In this way, the die 240 may communicate with the flip chip die 260 through the base or bottom substrate 210, the interposer connects 250, the interposer substrate 220, and the memory connects 270. If the flip chip die 260 is a memory, then the die 240 may access the memory 260.

The stacked substrate package 200 may yet comprise external connects 280 (e.g., ball grid array (BGA)) on a lower surface of the base substrate 210. The external connects 280 may enable the stacked substrate package 200 to be connected to devices external to the stacked substrate package 200.

Figure 4A:
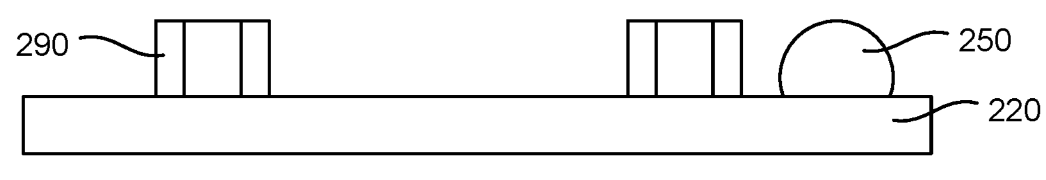
FIGS. 4A-4F illustrate examples of stages of fabricating a stacked substrate package in accordance with one or more aspects of the disclosure.

FIGS. 4A-4F illustrate examples of stages of fabricating a stacked substrate package-such as the stacked substrate package 200—in accordance with one or more aspects of the disclosure. In particular, these figures illustrate a process of incorporating horizontal SMDs 290. FIG. 4A illustrates a stage in which a surface mount technology (SMT) process is performed on the interposer substrate 220. In particular, the horizontal SMDs 290 and the interposer connects 250 may be attached to the interposer substrate 220.

Figure 4B:
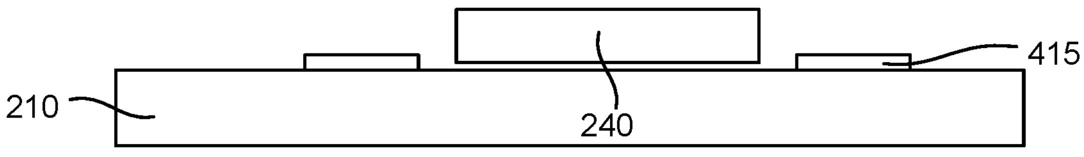

FIG. 4B illustrates a stage in which the die 240 and solder paste 415 are placed on the base substrate 210. The solder paste 415 may be printed on the base substrate 210 in locations corresponding to the locations of the horizontal SMDs 290.

Figure 4C:
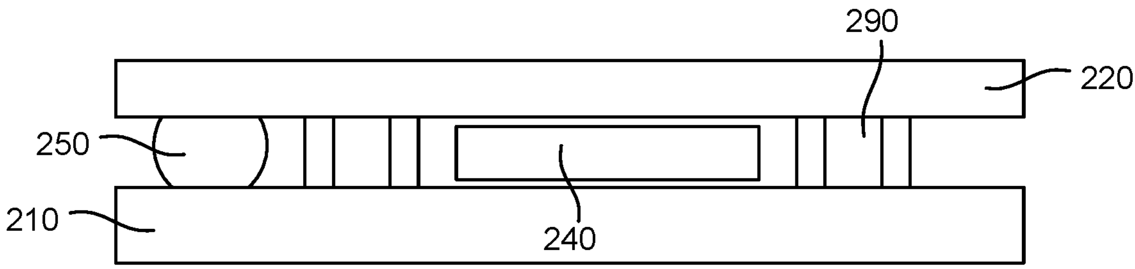

FIG. 4C illustrates a stage in which the interposer substrate 220 is flipped and placed on the base substrate 210. Thereafter, a reflow may be performed.

Figure 4D:
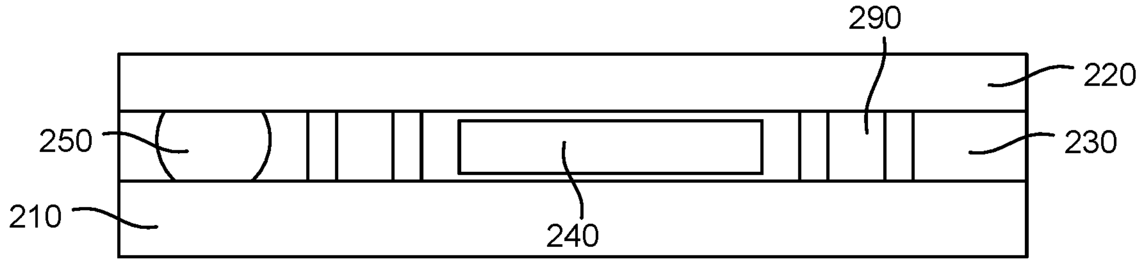

FIG. 4D illustrates a stage in which the space between the base and interposer substrates 210, 220 may be filled with the molding/encapsulant 230.

Figure 4E:
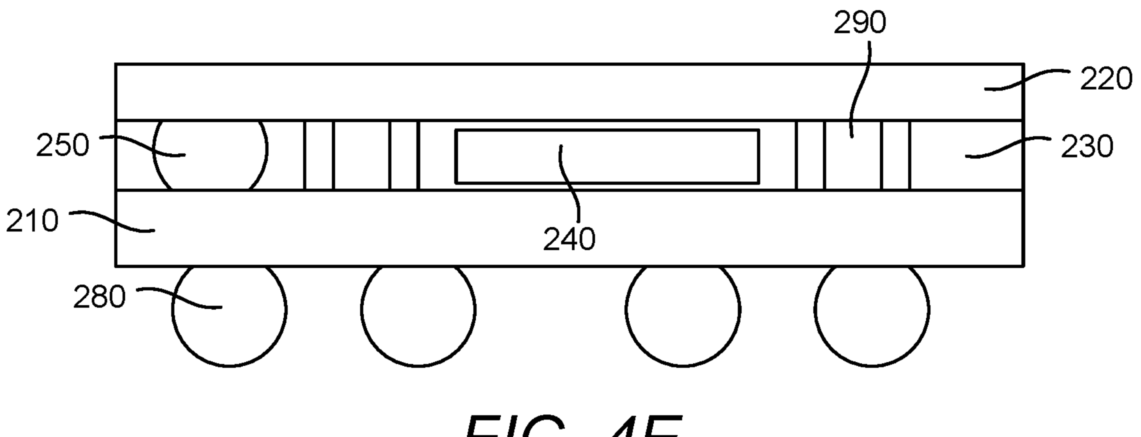

FIG. 4E illustrates a stage in which the external connects 280 may be attached to the base substrate.

Figure 4F:
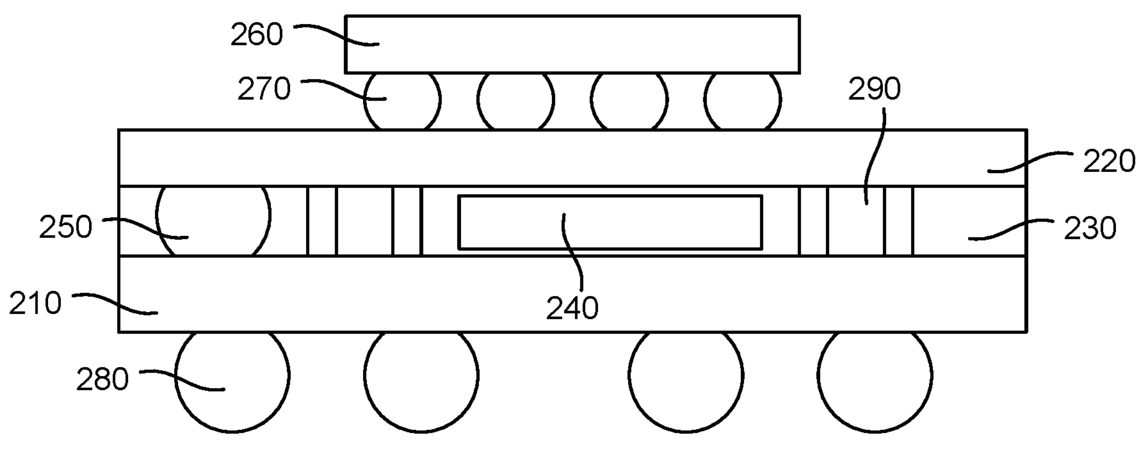

FIG. 4F illustrates a stage in which the device 260 may be connected to the interposer substrate 220. For example, a PoP process may be performed, e.g., to attach a flip chip device (e.g., memory) and device connects 270 to the interposer substrate 220.

Figure 5A:
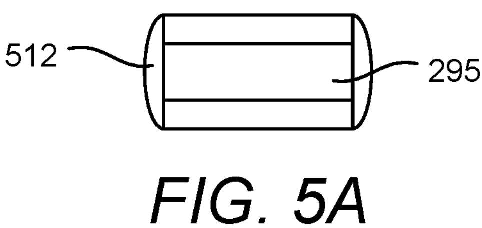
FIGS. 5A-5C illustrate examples of stages of preparing vertical surface mounted devices in accordance with one or more aspects of the disclosure.
Figure 5B:
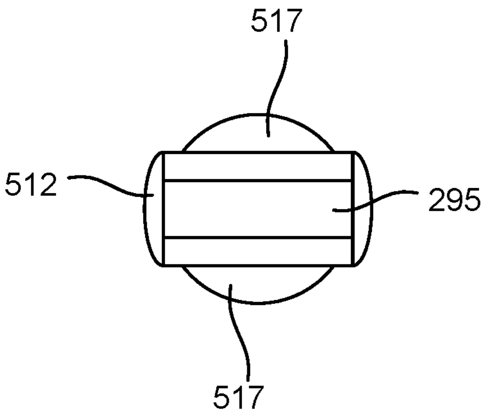
Figure 5C:
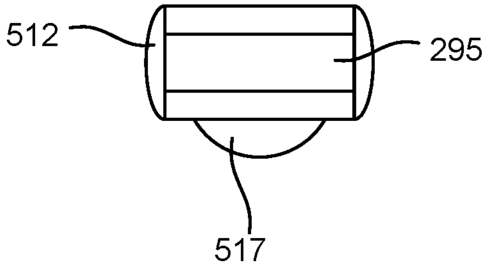

FIGS. 5A-5C illustrate examples of stages of preparing vertical SMDs 295 in accordance with one or more aspects of the disclosure. FIG. 5A illustrates a stage in which solder resist 512 may be applied to a vertical SMD 295. In this way, shorting of the terminals of the vertical SMD 295 may be prevented.

FIG. 5B illustrates forming solder 517 on both terminals of the vertical SMD 295. Alternatively, only one terminal may be soldered, as illustrated in FIG. 5C. The prepared vertical SMDs 295 may then be incorporated into the fabrication. For example, stages illustrated in FIGS. 4A, 4B, and 4C may be modified to include the vertical SMDs 295.

Figure 6:
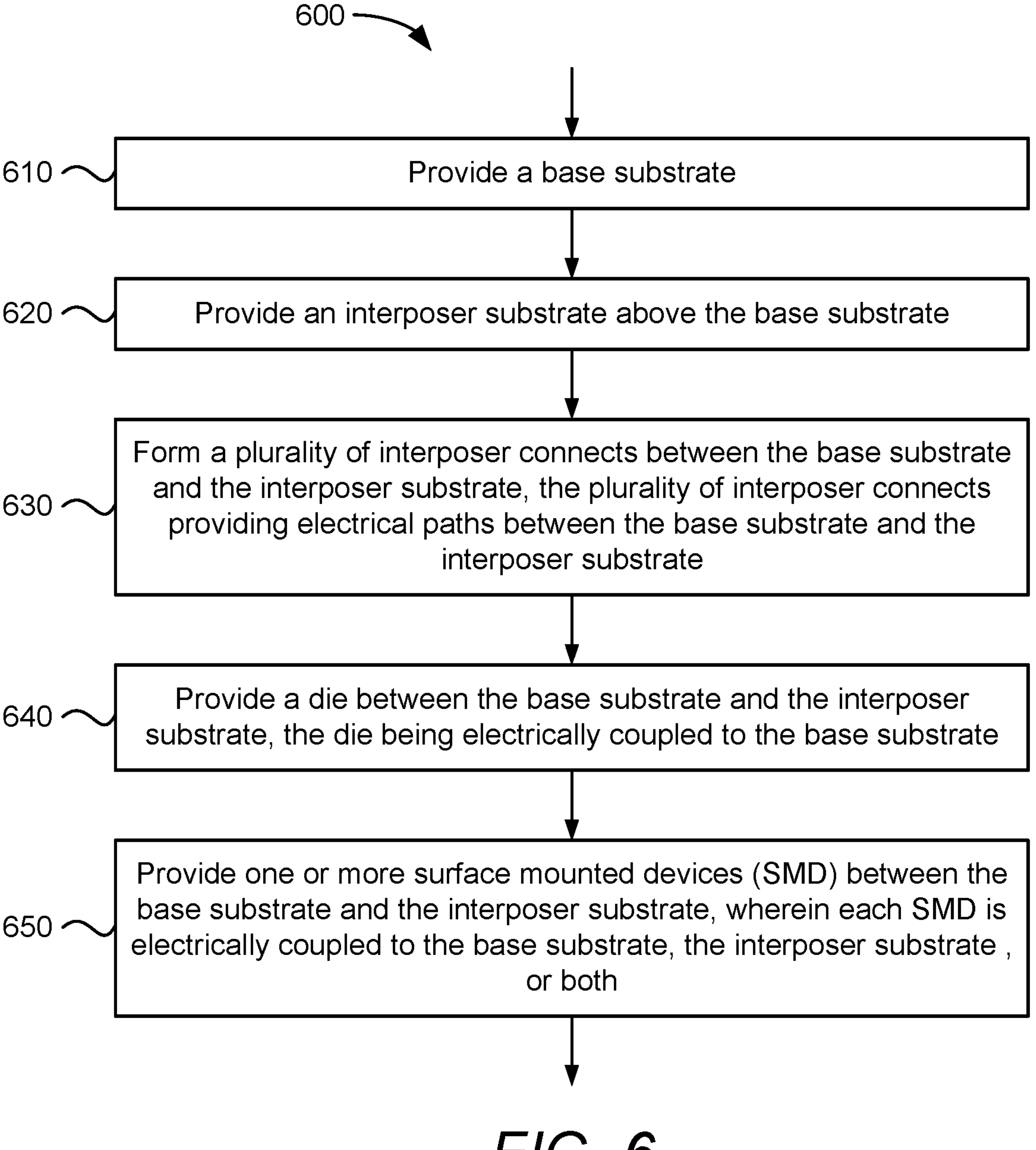
FIGS. 6 and 7 illustrate flow charts of example methods of manufacturing a stacked substrate package in accordance with one or more aspects of the disclosure.

FIG. 6 illustrates a flow chart of an example method 600 of fabricating a stacked substrate package, such as the stacked substrate package 200, in accordance with one or more aspects of the disclosure.

In block 610, a base substrate 210 may be provided. In an aspect, block 610 may correspond to the stage illustrated in FIG. 4B.

In block 620, an interposer substrate 220 may be provided above the base substrate 210. In an aspect, block 620 may correspond to the stages illustrated in FIGS. 4A-4C.

In block 630, a plurality of interposer connects 250 may be formed between the base substrate 210 and the interposer substrate 220. The plurality of interposer connects 250 may provide electrical paths between the base substrate 210 and the interposer substrate 220. That is, the interposer connects 250 may electrically couple routing layers (signal and/or power) of the base substrate 210 with the routing layers (signal and/or power) of the interposer substrate 220. In an aspect, block 630 may correspond to the stages illustrated in FIGS. 4A-4C.

In block 640, a die 240 may be provided between the base substrate 210 and the interposer substrate 220. The die 240 may be electrically coupled to the base substrate 210. That is, connections of the die 240 may be electrically coupled to the routing layers (signal and/or power) of the base substrate 210. In an aspect, block 640 may correspond to the stages illustrated in FIGS. 4B-4C.

In block 650, one or more surface mounted devices (SMD) 290, 295 may be provided between the base substrate 210 and the interposer substrate 220. Each SMD 290, 295 may be electrically coupled to the base substrate 210, the interposer substrate 220, or both. That is, terminals of each SMD 290, 295 may be electrically coupled to the routing layers (signal and/or power) of the base substrate 210 and/or with the routing layers (signal and/or power) of the interposer substrate 220. In this block, the horizontal SMDs 290 and/or the vertical SMDs 295 may be provided. In an aspect, block 650 may correspond to the stages illustrated in FIGS. 4A-4C.

Figure 7:
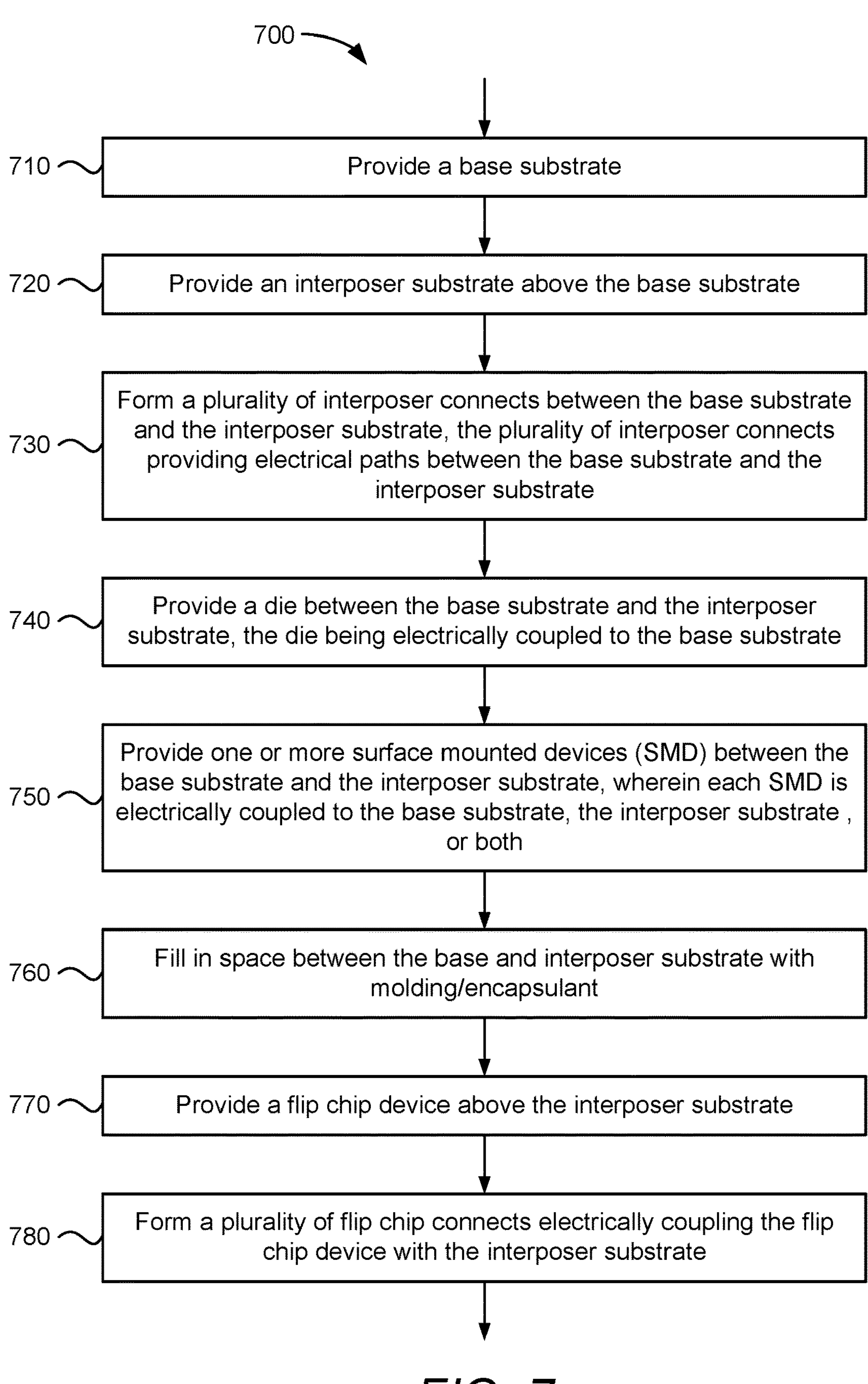

FIG. 7 illustrates a flow chart of an example method 700 of fabricating a stacked substrate package, such as the stacked substrate package 200, in accordance with one or more aspects of the disclosure. FIG. 7 may be viewed as being more comprehensive than FIG. 6.

Block 710 may be similar to block 610. That is, in block 710, a base substrate 210 may be provided. In an aspect, block 710 may correspond to the stage illustrated in FIG. 4B.

Block 720 may be similar to block 620. That is, in block 720, an interposer substrate 220 may be provided above the base substrate 210. In an aspect, block 720 may correspond to the stages illustrated in FIGS. 4A-4C.

Block 720 may be similar to block 620. That is, in block 720, an interposer substrate 220 may be provided above the base substrate 210 may be provided. In an aspect, block 720 may correspond to the stages illustrated in FIGS. 4A-4C.

Block 730 may be similar to block 630. That is, in block 730, a plurality of interposer connects 250 may be formed between the base substrate 210 and the interposer substrate 220. The plurality of interposer connects 250 may provide electrical paths between the base substrate 210 and the interposer substrate 220. That is, the interposer connects 250 may electrically couple routing layers (signal and/or power) of the base substrate 210 with the routing layers (signal and/or power) of the interposer substrate 220. In an aspect, block 730 may correspond to the stages illustrated in FIGS. 4A-4C.

Block 740 may be similar to block 640. That is, in block 740, a die 240 may be provided between the base substrate 210 and the interposer substrate 220. The die 240 may be electrically coupled to the base substrate 210. That is, connections of the die 240 may be electrically coupled to the routing layers (signal and/or power) of the base substrate 210. In an aspect, block 740 may correspond to the stages illustrated in FIGS. 4B-4C.

Block 750 may be similar to block 650. That is, in block 750, one or more surface mounted devices (SMD) 290, 295 may be provided between the base substrate 210) and the interposer substrate 220. Each SMD 290, 295 may be electrically coupled to the base substrate 210, the interposer substrate 220, or both. That is, terminals of each SMD 290, 295 may be electrically coupled to the routing layers (signal and/or power) of the base substrate 210 and/or with the routing layers (signal and/or power) of the interposer substrate 220. In this block, the horizontal SMDs 290 and/or the vertical SMDs 295 may be provided. In an aspect, block 750 may correspond to the stages illustrated in FIGS. 4A-4C.

In block 760, the space between the base and interposer substrates 210, 220 may be filled with molding/encapsulant 230. In an aspect, block 760 may correspond to the stage illustrated in FIG. 4D.

In block 770, a flip chip device 260 (e.g., memory device) may be provided above the interposer substrate 220. In an aspect, block 770 may correspond to the stage illustrated in FIG. 4F.

In block 780, a plurality of flip chip connects 270 may be formed to electrically couple the flip chip device 260 with the interposer substrate 220. That is, connections of the flip chip device 260 may be electrically coupled with the routing layers (signal and/or power) of the interposer substrate. In an aspect, block 780 may correspond to the stage illustrated in FIG. 4F.

Figure 8:
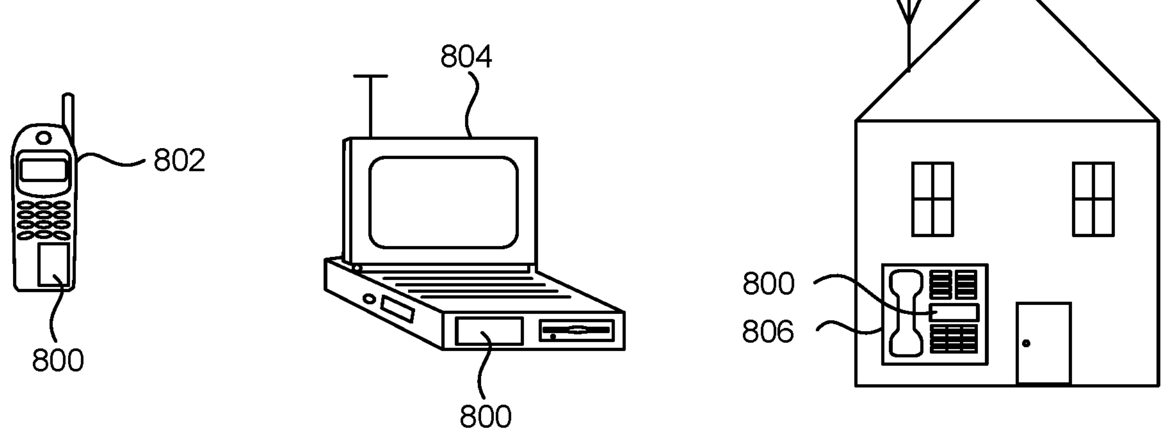
FIG. 8 illustrates various electronic devices which may utilize one or more aspects of the disclosure.

FIG. 8 illustrates various electronic devices 800 that may be integrated with any of the aforementioned stacked substrate packages in accordance with various aspects of the disclosure. For example, a mobile phone device 802, a laptop computer device 804, and a fixed location terminal device 806 may each be considered generally user equipment (UE) and may include one or more stacked substrate packages (e.g., stacked substrate package 200) as described herein. The devices 802, 804, 806 illustrated in FIG. 8 are merely exemplary. Other electronic devices may also include the stacked substrate packages including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into an antenna on glass device. The antenna on glass device may then be employed in devices described herein.

Implementation examples are described in the following numbered clauses:

Clause 1: A stacked substrate package, comprising: a base substrate; an interposer substrate above the base substrate; a plurality of interposer connects between the base substrate and the interposer substrate, the plurality of interposer connects providing electrical paths between the base substrate and the interposer substrate; a die between the base substrate and the interposer substrate, the die being electrically coupled to the base substrate; and one or more surface mounted devices (SMD) between the base substrate and the interposer substrate, wherein each SMD is electrically coupled to the base substrate, the interposer substrate, or both.

Clause 2: The stacked substrate package of clause 1, wherein at least one SMD is a passive device.

Clause 3: The stacked substrate package of clause 2, wherein the at least one SMD is a capacitor.

Clause 4: The stacked substrate package of any of clauses 1-3, wherein at least one SMD is coupled to a routing layer of the base substrate, or to a routing layer of the interposer substrate, or both.

Clause 5: The stacked substrate package of clause 4, wherein the routing layer of the base substrate is a power distribution network (PDN) routing layer of the base substrate, or wherein the routing layer of the interposer substrate is a PDN routing layer of the interposer substrate, or both.

Clause 6: The stacked substrate package of any of clauses 4-5, wherein the SMD is a horizontal SMD comprises first and second terminals, wherein the first terminal of the horizontal SMD is electrically coupled to the routing layer of the base substrate, or to the routing layer of the interposer substrate, or both, and wherein the second terminal of the horizontal SMD is electrically coupled to the routing layer of the base substrate, or to the routing layer of the interposer substrate, or both.

Clause 7: The stacked substrate package of any of clauses 4-6, wherein the SMD is a vertical SMD comprises first and second terminals, wherein the first terminal of the vertical SMD is electrically coupled to the routing layer of the base substrate, and wherein the second terminal of the vertical SMD is electrically coupled to the routing layer of the interposer substrate.

Clause 8: The stacked substrate package of any of clauses 1-7, wherein at least one interposer connect is formed from solder.

Clause 9: The stacked substrate package of any of clauses 1-8, further comprising: a memory above the interposer substrate; and a plurality of memory connects electrically coupling the memory with the interposer substrate.

Clause 10: The stacked substrate package of any of clauses 1-9, wherein the stacked substrate package is incorporated into an apparatus selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Clause 11: A method of fabricating a stacked substrate package, the method comprising: providing a base substrate; providing an interposer substrate above the base substrate; forming a plurality of interposer connects between the base substrate and the interposer substrate, the plurality of interposer connects providing electrical paths between the base substrate and the interposer substrate; providing a die between the base substrate and the interposer substrate, the die being electrically coupled to the base substrate; and providing one or more surface mounted devices (SMD) between the base substrate and the interposer substrate, wherein each SMD is electrically coupled to the base substrate, the interposer substrate, or both.

Clause 12: The method of clause 11, wherein at least one SMD is a passive device.

Clause 13: The method of clause 12, wherein the at least one SMD is a capacitor.

Clause 14: The method of any of clauses 11-13, wherein at least one SMD is coupled to a routing layer of the base substrate, or to a routing layer of the interposer substrate, or both.

Clause 15: The method of clause 14, wherein the routing layer of the base substrate is a power distribution network (PDN) routing layer of the base substrate, or wherein the routing layer of the interposer substrate is a PDN routing layer of the interposer substrate, or both.

Clause 16: The method of any of clauses 14-15, wherein the SMD is a horizontal SMD comprises first and second terminals, wherein the first terminal of the horizontal SMD is electrically coupled to the routing layer of the base substrate, or to the routing layer of the interposer substrate, or both, and wherein the second terminal of the horizontal SMD is electrically coupled to the routing layer of the base substrate, or to the routing layer of the interposer substrate, or both.

Clause 17: The method of any of clauses 14-16, wherein the SMD is a vertical SMD comprises first and second terminals, wherein the first terminal of the vertical SMD is electrically coupled to the routing layer of the base substrate, and wherein the second terminal of the vertical SMD is electrically coupled to the routing layer of the interposer substrate.

Clause 18: The method of any of clauses 11-17, wherein at least one interposer connect is formed from solder.

Clause 19: The method of any of clauses 14-15, further comprising: providing a flip chip device above the interposer substrate; and forming a plurality of flip chip connects electrically coupling the flip chip device with the interposer substrate.

Clause 20: The method of clause 19, wherein the flip chip device is a memory device As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or one or more claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A stacked substrate package, comprising:

a base substrate;

an interposer substrate above the base substrate;

a plurality of interposer connects between the base substrate and the interposer substrate, the plurality of interposer connects providing electrical paths between the base substrate and the interposer substrate;

a die between the base substrate and the interposer substrate, the die being electrically coupled to the base substrate; and one or more surface mounted devices (SMD) between the base substrate and the interposer substrate, wherein each SMD is electrically coupled to the base substrate, the interposer substrate, or both, and wherein the one or more SMDs include at least one horizontal SMD, and at least one terminal of the at least one horizontal SMD is directly electrically coupled to the base substrate, and a height of the at least one horizontal SMD is equal to a height of the plurality of interposer connects.

2. The stacked substrate package of claim 1, wherein at least one SMD of the one or more SMDs is a passive device.

3. The stacked substrate package of claim 2, wherein the at least one SMD is a capacitor.

4. The stacked substrate package of claim 1, wherein at least one SMD of the one or more SMDs is coupled to a routing layer of the base substrate, or to a routing layer of the interposer substrate, or both.

5. The stacked substrate package of claim 4, wherein the routing layer of the base substrate is a power distribution network (PDN) routing layer of the base substrate, or wherein the routing layer of the interposer substrate is a PDN routing layer of the interposer substrate, or both.

6. The stacked substrate package of claim 4, wherein the at least one SMD is a horizontal SMD comprising first and second terminals, wherein the first terminal of the horizontal SMD is electrically coupled to the routing layer of the base substrate, or to the routing layer of the interposer substrate, or both, and wherein the second terminal of the horizontal SMD is electrically coupled to the routing layer of the base substrate, or to the routing layer of the interposer substrate, or both.

7. The stacked substrate package of claim 4, wherein the at least one SMD is a vertical SMD comprising first and second terminals, wherein the first terminal of the vertical SMD is electrically coupled to the routing layer of the base substrate, and wherein the second terminal of the vertical SMD is electrically coupled to the routing layer of the interposer substrate.

8. The stacked substrate package of claim 1, wherein at least one interposer connect is formed from solder.

9. The stacked substrate package of claim 1, further comprising:

a memory above the interposer substrate; and a plurality of memory connects electrically coupling the memory with the interposer substrate.

10. The stacked substrate package of claim 1, wherein the stacked substrate package is incorporated into an apparatus selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

11. A method of fabricating a stacked substrate package, the method comprising:

providing a base substrate;

providing an interposer substrate above the base substrate;

forming a plurality of interposer connects between the base substrate and the interposer substrate, the plurality of interposer connects providing electrical paths between the base substrate and the interposer substrate;

providing a die between the base substrate and the interposer substrate, the die being electrically coupled to the base substrate; and providing one or more surface mounted devices (SMD) between the base substrate and the interposer substrate, wherein each SMD is electrically coupled to the base substrate, the interposer substrate, or both, and wherein the one or more SMDs include at least one horizontal SMD, and at least one terminal of the at least one horizontal SMD is directly electrically coupled to the base substrate, and a height of the at least one horizontal SMD is equal to a height of the plurality of interposer connects.

12. The method of claim 11, wherein at least one SMD of the one or more SMDs is a passive device.

13. The method of claim 12, wherein the at least one SMD is a capacitor.

14. The method of claim 11, wherein at least one SMD of the one or more SMDs is coupled to a routing layer of the base substrate, or to a routing layer of the interposer substrate, or both.

15. The method of claim 14, wherein the routing layer of the base substrate is a power distribution network (PDN) routing layer of the base substrate, or wherein the routing layer of the interposer substrate is a PDN routing layer of the interposer substrate, or both.

16. The method of claim 14, wherein the at least one SMD is a horizontal SMD comprising first and second terminals, wherein the first terminal of the horizontal SMD is electrically coupled to the routing layer of the base substrate, or to the routing layer of the interposer substrate, or both, and wherein the second terminal of the horizontal SMD is electrically coupled to the routing layer of the base substrate, or to the routing layer of the interposer substrate, or both.

17. The method of claim 14, wherein the at least one SMD is a vertical SMD comprising first and second terminals, wherein the first terminal of the vertical SMD is electrically coupled to the routing layer of the base substrate, and wherein the second terminal of the vertical SMD is electrically coupled to the routing layer of the interposer substrate.

18. The method of claim 11, wherein at least one interposer connect is formed from solder.

19. The method of claim 11, further comprising:

providing a flip chip device above the interposer substrate; and forming a plurality of flip chip connects electrically coupling the flip chip device with the interposer substrate.

20. The method of claim 19, wherein the flip chip device is a memory device.

* * * * *